US008698558B2

(12) United States Patent
Mathe et al.

(10) Patent No.: US 8,698,558 B2
(45) Date of Patent: Apr. 15, 2014

(54) LOW-VOLTAGE POWER-EFFICIENT ENVELOPE TRACKER

(75) Inventors: Lennart K Mathe, San Diego, CA (US); Thomas Domenick Marra, San Diego, CA (US); Todd R Sutton, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 38 days.

(21) Appl. No.: 13/167,659

(22) Filed: Jun. 23, 2011

(65) Prior Publication Data

US 2012/0326783 A1 Dec. 27, 2012

(51) Int. Cl.
*H03F 3/217* (2006.01)

(52) U.S. Cl.
USPC ............................ 330/251; 330/136; 330/297

(58) Field of Classification Search
USPC .................. 330/10, 136, 207 A, 251, 297
See application file for complete search history.

(56) References Cited

U.S. PATENT DOCUMENTS

| 5,905,407 | A | * | 5/1999 | Midya | 330/10 |
| 6,300,826 | B1 | | 10/2001 | Mathe et al. | |
| 6,661,217 | B2 | | 12/2003 | Kimball et al. | |
| 6,792,252 | B2 | | 9/2004 | Kimball et al. | |
| 6,838,931 | B2 | * | 1/2005 | Midya et al. | 330/10 |
| 7,061,313 | B2 | | 6/2006 | Kimball et al. | |
| 7,068,984 | B2 | | 6/2006 | Mathe et al. | |
| 7,368,985 | B2 | | 5/2008 | Kusunoki | |
| 7,679,433 | B1 | | 3/2010 | Li | |
| 7,755,431 | B2 | * | 7/2010 | Sun | 330/297 |
| 7,932,780 | B2 | * | 4/2011 | Elia | 330/136 |
| 8,030,995 | B2 | * | 10/2011 | Okubo et al. | 330/297 |
| 8,237,499 | B2 | * | 8/2012 | Chen et al. | 330/136 |
| 2005/0046474 | A1 | | 3/2005 | Matsumoto et al. | |
| 2005/0215209 | A1 | | 9/2005 | Tanabe et al. | |
| 2008/0278136 | A1 | | 11/2008 | Murtojarvi | |
| 2010/0001793 | A1 | | 1/2010 | Van Zeijl et al. | |
| 2011/0095827 | A1 | | 4/2011 | Tanaka et al. | |
| 2012/0293253 | A1 | * | 11/2012 | Khlat et al. | 330/127 |

OTHER PUBLICATIONS

Choi, et al., "Envelope Tracking Power Amplifier Robust to Battery Depletion," 2010 IEEE.
MTT-S International Microwave SYmposium Digest (MTT), May 2010.

(Continued)

*Primary Examiner* — Khanh V Nguyen
(74) *Attorney, Agent, or Firm* — William M. Hooks

(57) ABSTRACT

Techniques for efficiently generating a power supply are described. In one design, an apparatus includes an envelope amplifier and a boost converter. The boost converter generates a boosted supply voltage having a higher voltage than a first supply voltage (e.g., a battery voltage). The envelope amplifier generates a second supply voltage based on an envelope signal and the boosted supply voltage (and also possibly the first supply voltage). A power amplifier operates based on the second supply voltage. In another design, an apparatus includes a switcher, an envelope amplifier, and a power amplifier. The switcher receives a first supply voltage and provides a first supply current. The envelope amplifier provides a second supply current based on an envelope signal. The power amplifier receives a total supply current including the first and second supply currents. In one design, the switcher detects the second supply current and adds an offset to generate a larger first supply current than without the offset.

20 Claims, 6 Drawing Sheets

(56) References Cited

OTHER PUBLICATIONS

Choi, J et al., "A Polar Transmitter With CMOS Programmable Hysteretic-Controlled Hybrid Switching Supply Modulator for Multi standard Applications", IEEE Transactions on Microwave Theory and Techniques, IEEE Service Center, Piscataway, NJ, US, vol. 57, No. 7, Jul. 1, 2009, pp. 1675-1686, XP011258456.

Ertl, H et al., "Basic Considerations and Topologies of Switched-Mode Assisted Linear Power Amplifiers", IEEE Transactions on Industrial Electronics, IEEE Service Center, Piscataway, NJ, USA, vol. 44, No. 1, Feb. 1, 1997, XP011023224.

International Search Report and Written Opinion—PCT/US2012/043915—ISA/EPO—Nov. 26, 2012.

Kang D., et al., "A Multimode/Multiband Power Amplifier With a Boosted Supply Modulator", IEEE Ransactions on Microwave Theory and Techniques, IEEE Service Center, Piscataway, NJ, US, vol. 58, No. 10, Oct. 1, 2010, pp. 2598-2608, XP011317521, ISSN: 0018-9480.

Kang, D et al., "LTE Power Amplifier for envelope tracking polar transmitters", Microwave Conference (EUMC), 2010, European, IEEE, Piscataway, NJ, USA, Sep. 28, 2010, pp. 628-631, XP031786114.

Kim D., et al., "High efficiency and wideband envelope tracking power amplifier with sweet spot tracking", Radio Frequency Integrated Circuits Symposium (RFIC), 2010 IEEE, IEEE, Piscataway, NJ, USA, May 23, 2010, pp. 255-258, XP031684103, ISBN: 978-1-4244-6240-7.

Li, Y et al., "High Efficiency Wide Bandwidth Power Supplies for GSM and EDGE RF Power Amplifiers", Conference Proceedings/IEEE International Symposium on Circuits and Systems (ISCAS): May 23-26, 2005, International Conference Center, Kobe, Japan, IEEE Service Center, Piscataway, NJ, May 23, 2005, pp. 1314-1317, XP010815779.

Partial International Search Report—PCT/US2012/043915—International Search Authority European Patent Office Oct. 4, 2012.

Stauth, J.T., et al., "Optimum Bias Calculation for Parallel Hybrid Switching-Linear Regulators", Applied Power Electronics Conference, APEC 2007—Twenty Second Annual IEEE, IEEE, PI, Feb. 1, 2007, pp. 569-574, XP031085267.

* cited by examiner

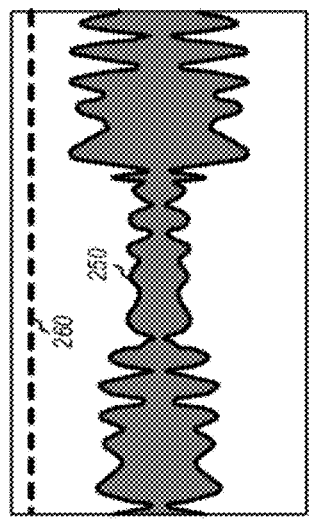
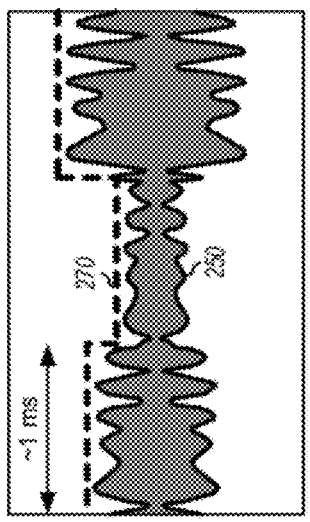
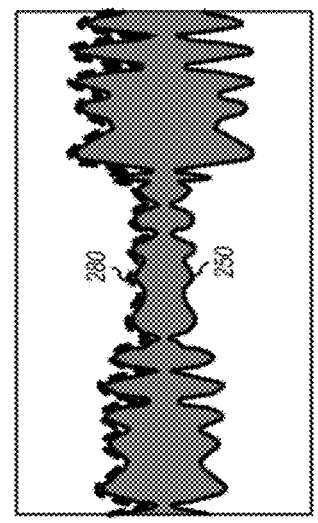
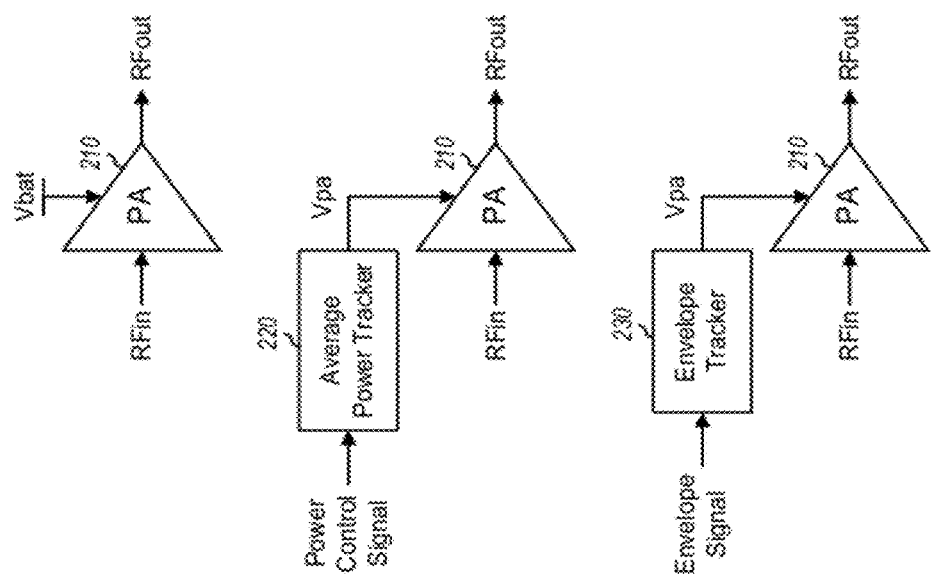
FIG. 2A
FIG. 2B
FIG. 2C

US 8,698,558 B2

LOW-VOLTAGE POWER-EFFICIENT ENVELOPE TRACKER

BACKGROUND

I. Field

The present disclosure relates generally to electronics, and more specifically to techniques for generating a power supply for an amplifier and/or other circuits.

II. Background

In a communication system, a transmitter may process (e.g., encode and modulate) data to generate output samples. The transmitter may further condition (e.g., convert to analog, filter, frequency upconvert, and amplify) the output samples to generate an output radio frequency (RF) signal. The transmitter may then transmit the output RF signal via a communication channel to a receiver. The receiver may receive the transmitted RF signal and perform the complementary processing on the received RF signal to recover the transmitted data.

The transmitter typically includes a power amplifier (PA) to provide high transmit power for the output RF signal. The power amplifier should be able to provide high output power and have high power-added efficiency (PAE). Furthermore, the power amplifier may be required to have good performance and high PAE even with a low battery voltage.

SUMMARY

Techniques for efficiently generating a power supply for a power amplifier and/or other circuits are described herein. In one exemplary design, an apparatus (e.g., an integrated circuit, a wireless device, a circuit module, etc.) may include an envelope amplifier and a boost converter. The boost converter may receive a first supply voltage (e.g., a battery voltage) and generate a boosted supply voltage having a higher voltage than the first supply voltage. The envelope amplifier may receive an envelope signal and the boosted supply voltage and may generate a second supply voltage based on the envelope signal and the boosted supply voltage. The apparatus may further include a power amplifier, which may operate based on the second supply voltage from the envelope amplifier. In one design, the envelope amplifier may further receive the first supply voltage and may generate the second supply voltage based on either the first supply voltage or the boosted supply voltage. For example, the envelope amplifier may generate the second supply voltage (i) based on the boosted supply voltage if the envelope signal exceeds a first threshold and/or if the first supply voltage is below a second threshold or (ii) based on the first supply voltage otherwise.

In another exemplary design, an apparatus may include a switcher, an envelope amplifier, and a power amplifier. The switcher may receive a first supply voltage (e.g., a battery voltage) and provide a first supply current. The envelope amplifier may receive an envelope signal and provide a second supply current based on the envelope signal. The power amplifier may receive a total supply current comprising the first supply current and the second supply current. The first supply current may include direct current (DC) and low frequency components. The second supply current may include higher frequency components. The apparatus may further include a boost converter, which may receive the first supply voltage and provide a boosted supply voltage. The envelope amplifier may then operate based on either the first supply voltage or the boosted supply voltage.

In yet another exemplary design, an apparatus may include a switcher that may sense an input current and generate a switching signal to charge and discharge an inductor providing a supply current. The switcher may add an offset to the input current to generate a larger supply current than without the offset. The apparatus may further include an envelope amplifier, a boost converter, and a power amplifier, which may operate as described above.

Various aspects and features of the disclosure are described in further detail below.

BRIEF DESCRIPTION OF THE DRAWINGS

FIGS. 2A, 2B and 2C show diagrams of operating a power amplifier based on a battery voltage, an average power tracker, and an envelope tracker, respectively.

DETAILED DESCRIPTION

The word "exemplary" is used herein to mean "serving as an example, instance, or illustration." Any design described herein as "exemplary" is not necessarily to be construed as preferred or advantageous over other designs.

Techniques for generating a power supply for an amplifier and/or other circuits are described herein. The techniques may be used for various types of amplifiers such as power amplifiers, driver amplifiers, etc. The techniques may also be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques to generate a power supply for a power amplifier in a wireless communication device is described below.

Figure 1:
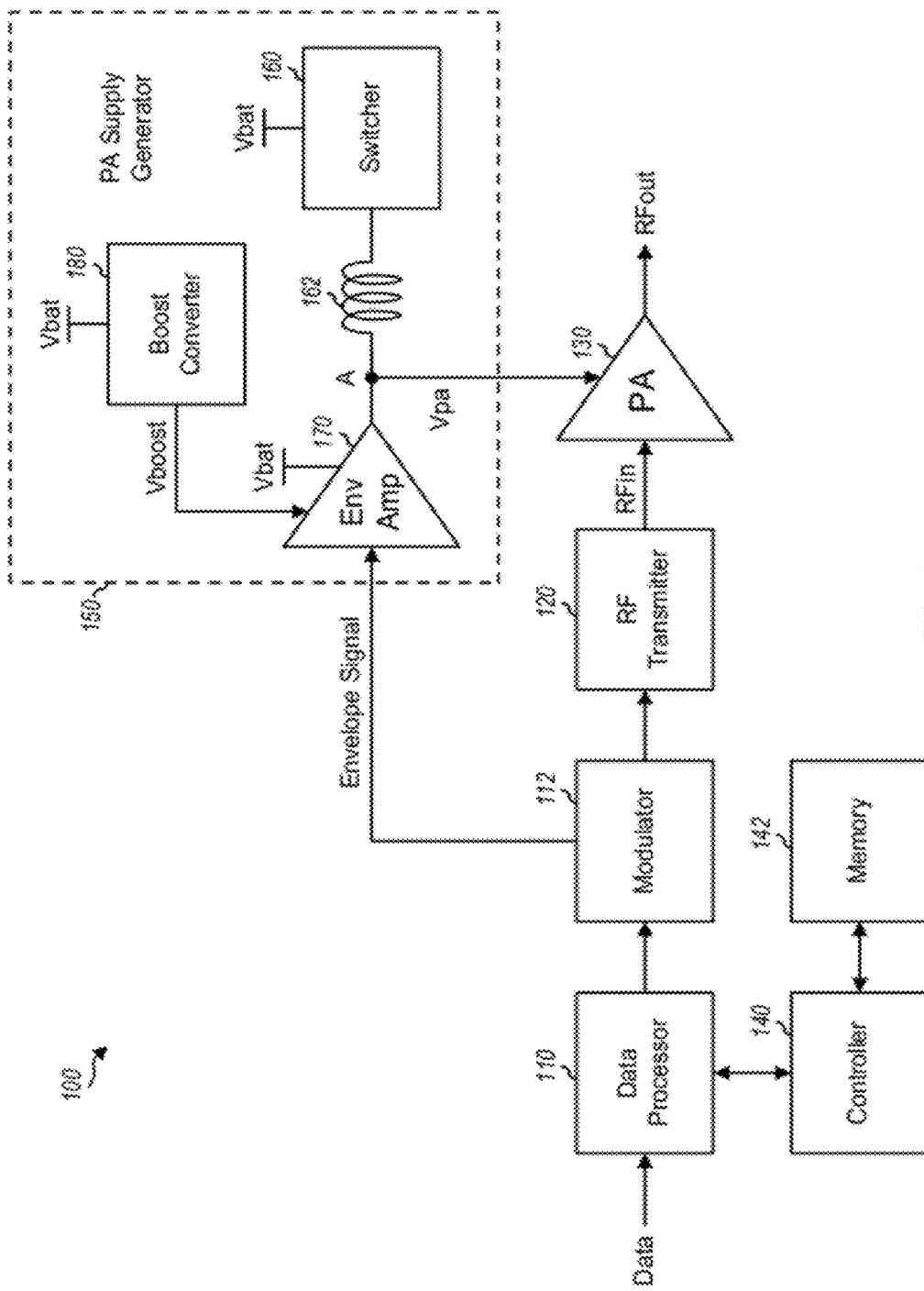
FIG. 1 shows a block diagram of a wireless communication device.

FIG. 1 shows a block diagram of a design of a wireless communication device 100. For clarity, only a transmitter portion of wireless device 100 is shown in FIG. 1, and a receiver portion is not shown. Within wireless device 100, a data processor 110 may receive data to be transmitted, process (e.g., encode, interleave, and symbol map) the data, and provide data symbols. Data processor 110 may also process pilot and provide pilot symbols. Data processor 110 may also process the data symbols and pilot symbols for code division multiple access (CDMA), time division multiple access (TDMA), frequency division multiple access (FDMA), orthogonal FDMA (OFDMA), single-carrier FDMA (SC-FDMA), and/or some other multiplexing scheme and may provide output symbols.

A modulator 112 may receive the output symbols from data processor 110, perform quadrature modulation, polar modulation, or some other type of modulation, and provide output samples. Modulator 112 may also determine the envelope of the output samples, e.g., by computing the magnitude of each output sample and averaging the magnitude across output samples. Modulator 112 may provide an envelope signal indicative of the envelope of the output samples.

An RF transmitter 120 may process (e.g., convert to analog, amplify, filter, and frequency upconvert) the output samples from modulator 112 and provide an input RF signal (RFin). A power amplifier (PA) 130 may amplify the input RF signal to obtain the desired output power level and provide an output RF signal (RFout), which may be transmitted via an antenna (not shown in FIG. 1). RF transmitter 120 may also include circuits to generate the envelope signal, instead of using modulator 112 to generate the envelope signal.

A PA supply generator 150 may receive the envelope signal from modulator 112 and may generate a power supply voltage (Vpa) for power amplifier 130. PA supply generator 150 may also be referred to as an envelope tracker. In the design shown in FIG. 1, PA supply generator 150 includes a switcher 160, an envelope amplifier (Env Amp) 170, a boost converter 180, and an inductor 162. Switcher 160 may also be referred to as a switching-mode power supply (SMPS). Switcher 160 receives a battery voltage (Vbat) and provides a first supply current (Iind) comprising DC and low frequency components at node A. Inductor 162 stores current from switcher 160 and provides the stored current to node A on alternating cycles. Boost converter 180 receives the Vbat voltage and generates a boosted supply voltage (Vboost) that is higher than the Vbat voltage. Envelope amplifier 170 receives the envelope signal at its signal input, receives the Vbat voltage and the Vboost voltage at its two power supply inputs, and provides a second supply current (Ienv) comprising high frequency components at node A. The PA supply current (Ipa) provided to power amplifier 130 includes the Iind current from switcher 160 and the Ienv current from envelope amplifier 170. Envelope amplifier 170 also provides the proper PA supply voltage (Vpa) at Node A for power amplifier 130. The various circuits in PA supply generator 150 are described in further detail below.

A controller 140 may control the operation of various units within wireless device 100. A memory 142 may store program codes and data for controller 140 and/or other units within wireless device 100. Data processor 110, modulator 112, controller 140, and memory 142 may be implemented on one or more application specific integrated circuits (ASICs) and/or other ICs.

FIG. 1 shows an exemplary design of wireless device 100. Wireless device 100 may also be implemented in other manners and may include different circuits than those shown in FIG. 1. All or a portion of RF transmitter 120, power amplifier 130, and PA supply generator 150 may be implemented on one or more analog integrated circuits (ICs), RF ICs (RFICs), mixed-signal ICs, etc.

It may be desirable to operate wireless device 100 with a low battery voltage in order to reduce power consumption, extend battery life, and/or obtain other advantages. New battery technology may be able to provide energy down to 2.5 volts (V) and below in the near future. However, a power amplifier may need to operate with a PA supply voltage (e.g., 3.2V) that is higher than the battery voltage. A boost converter may be used to boost the battery voltage to generate the higher PA supply voltage. However, the use of the boost converter to directly supply the PA supply voltage may increase cost and power consumption, both of which are undesirable.

PA supply generator 150 can efficiently generate the PA supply voltage with envelope tracking to avoid the disadvantages of using a boost converter to directly provide the PA supply voltage. Switcher 160 may provide the bulk of the power for power amplifier 130 and may be connected directly to the battery voltage. Boost converter 180 may provide power to only envelope amplifier 170. PA supply generator 150 can generate the PA supply voltage to track the envelope of the RFin signal provided to power amplifier 130, so that just the proper amount of PA supply voltage is supplied to power amplifier 130.

FIG. 2A shows a diagram of using a battery voltage for a power amplifier 210. The RFout signal (which follows the RFin signal) has a time-varying envelope and is shown by a plot 250. The battery voltage is shown by a plot 260 and is higher than the largest amplitude of the envelope in order to avoid clipping of the RFout signal from power amplifier 210. The difference between the battery voltage and the envelope of the RFout signal represents wasted power that is dissipated by power amplifier 210 instead of delivered to an output load.

FIG. 2B shows a diagram of generating a PA supply voltage (Vpa) for power amplifier 210 with an average power tracker (APT) 220. APT 220 receives a power control signal indicating the largest amplitude of the envelope of the RFout signal in each time interval. APT 220 generates the PA supply voltage (which is shown by a plot 270) for power amplifier 210 based on the power control signal. The difference between the PA supply voltage and the envelope of the RFout signal represents wasted power. APT 220 can reduce wasted power since it can generate the PA supply voltage to track the largest amplitude of the envelope in each time interval.

FIG. 2C shows a diagram of generating a PA supply voltage for power amplifier 210 with an envelope tracker 230. Envelope tracker 230 receives an envelope signal indicative of the envelope of the RFout signal and generates the PA supply voltage (which is shown by a plot 280) for power amplifier 210 based on the envelope signal. The PA supply voltage closely tracks the envelope of the RFout signal over time. Hence, the difference between the PA supply voltage and the envelope of the RFout signal is small, which results in less wasted power. The power amplifier is operated in saturation for all envelope amplitudes in order to maximize PA efficiency.

PA supply generator 150 in FIG. 1 can implement envelope tracker 230 in FIG. 2C with high efficiency. This is achieved by a combination of (i) an efficient switcher 160 to generate a first supply current (Iind) with a switch mode power supply and (ii) a linear envelope amplifier 170 to generate a second supply current (Ienv).

Figure 3:
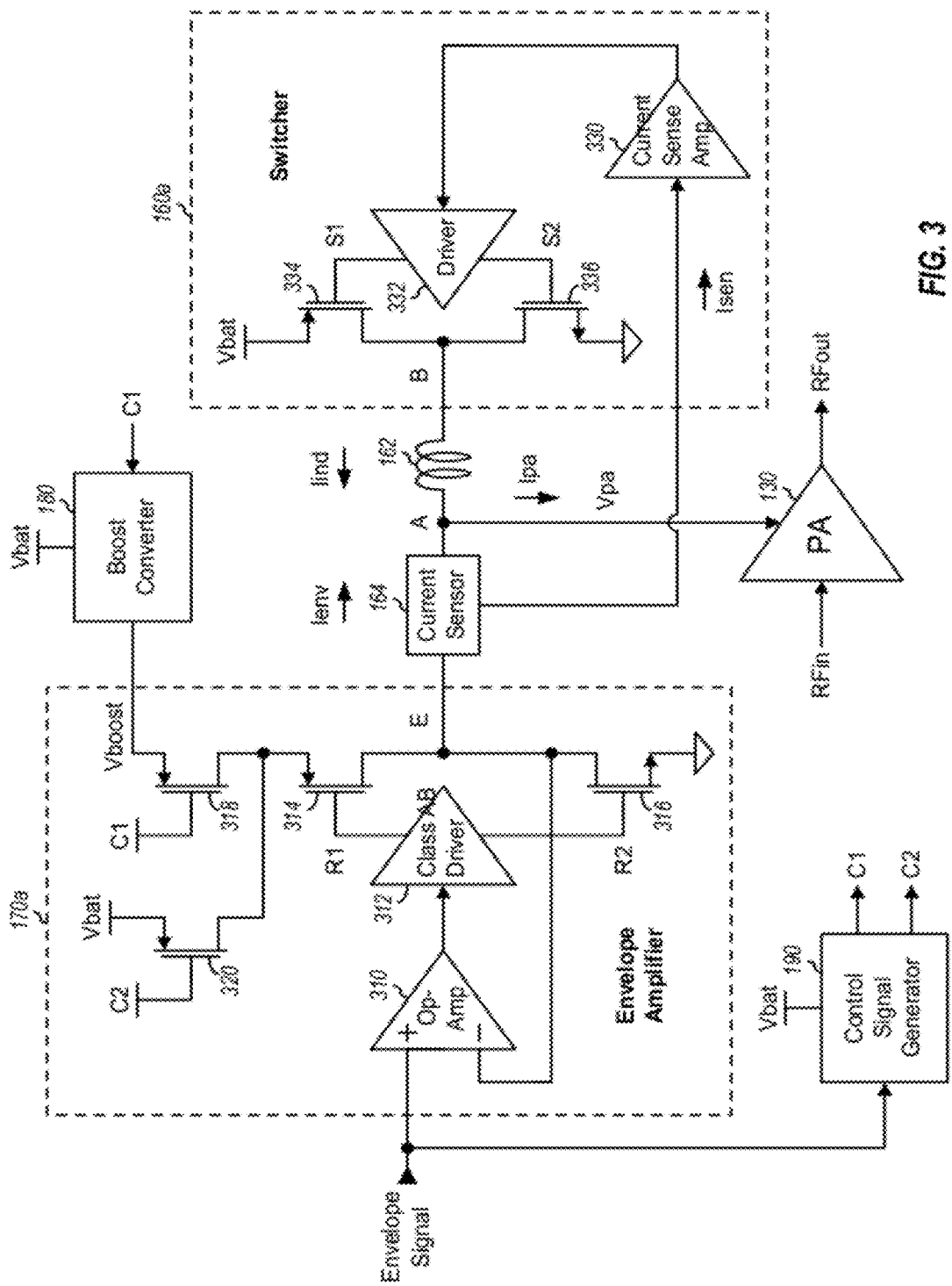
FIG. 3 shows a schematic diagram of a switcher and an envelope amplifier.

FIG. 3 shows a schematic diagram of a switcher 160a and an envelope amplifier 170a, which are one design of switcher 160 and envelope amplifier 170, respectively, in FIG. 1. Within envelope amplifier 170a, an operational amplifier (op-amp) 310 has its non-inverting input receiving the envelope signal, its inverting input coupled to an output of envelope amplifier 170a (which is node E), and its output coupled to an input of a class AB driver 312. Driver 312 has its first output (R1) coupled to the gate of a P-channel metal oxide semiconductor (PMOS) transistor 314 and its second output (R2) coupled to the gate of an N-channel MOS (NMOS) transistor 316. NMOS transistor 316 has its drain coupled to node E and its source coupled to circuit ground. PMOS transistor 314 has its drain coupled to node E and its source coupled to the drains of PMOS transistors 318 and 320. PMOS transistor 318 has its gate receiving a C1 control signal and its source receiving the Vboost voltage. PMOS transistor 320 has its gate receiving a C2 control signal and its source receiving the Vbat voltage.

A current sensor 164 is coupled between node E and node A and senses the Ienv current provided by envelope amplifier 170a. Sensor 164 passes most of the Ienv current to node A and provides a small sensed current (Isen) to switcher 160a. The Isen current is a small fraction of the Ienv current from envelope amplifier 170a.

Within switcher 160a, a current sense amplifier 330 has its input coupled to current sensor 164 and its output coupled to an input of a switcher driver 332. Driver 332 has its first output (S1) coupled to the gate of a PMOS transistor 334 and its second output (S2) coupled to the gate of an NMOS transistor 336. NMOS transistor 336 has its drain coupled to an output of switcher 160a (which is node B) and its source coupled to circuit ground. PMOS transistor 334 has its drain coupled to node B and its source receiving the Vbat voltage. Inductor 162 is coupled between nodes A and B.

Switcher 160a operates as follows. Switcher 160a is in an On state when current sensor 164 senses a high output current from envelope amplifier 170a and provides a low sensed voltage to driver 332. Driver 332 then provides a low voltage to the gate of PMOS transistor 334 and a low voltage to the gate of NMOS transistor 336. PMOS transistor 334 is turned on and couples the Vbat voltage to inductor 162, which stores energy from the Vbat voltage. The current through inductor 162 rises during the On state, with the rate of the rise being dependent on (i) the difference between the Vbat voltage and the Vpa voltage at node A and (ii) the inductance of inductor 162. Conversely, switcher 160a is in an Off state when current sensor 164 senses a low output current from envelope amplifier 170a and provides a high sensed voltage to driver 332. Driver 332 then provides a high voltage to the gate of PMOS transistor 334 and a high voltage to the gate of NMOS transistor 336. NMOS transistor 336 is turned on, and inductor 162 is coupled between node A and circuit ground. The current through inductor 162 falls during the Off state, with the rate of the fall being dependent on the Vpa voltage at node A and the inductance of inductor 162. The Vbat voltage thus provides current to power amplifier 130 via inductor 162 during the On state, and inductor 120 provides its stored energy to power amplifier 130 during the Off state.

In one design, envelope amplifier 170a operates based on the Vboost voltage only when needed and based on the Vbat voltage the remaining time in order to improve efficiency. For example, envelope amplifier 170a may provide approximately 85% of the power based on the Vbat voltage and only approximately 15% of the power based on the Vboost voltage. When a high Vpa voltage is needed for power amplifier 130 due to a large envelope on the RFout signal, the C1 control signal is at logic low, and the C2 control signal is at logic high. In this case, boost converter 180 is enabled and generates the Vboost voltage, PMOS transistor 318 is turned on and provides the Vboost voltage to the source of PMOS transistor 314, and PMOS transistor 320 is turned off Conversely, when a high Vpa voltage is not needed for power amplifier 130, the C1 control signal is at logic high, and the C2 control signal is at logic low. In this case, boost converter 180 is disabled, PMOS transistor 318 is turned off, and PMOS transistor 320 is turned on and provides the Vbat voltage to the source of PMOS transistor 314.

Envelope amplifier 170a operates as follows. When the envelope signal increases, the output of op-amp 310 increases, the R1 output of driver 312 deceases and the R2 output of driver 312 decreases until NMOS transistor 316 is almost turned off, and the output of envelope amplifier 170a increases. The converse is true when the envelope signal decreases. The negative feedback from the output of envelope amplifier 170a to the inverting input of op-amp 310 results in envelope amplifier 170a having unity gain. Hence, the output of envelope amplifier 170a follows the envelope signal, and the Vpa voltage is approximately equal to the envelope signal. Driver 312 may be implemented with a class AB amplifier to improve efficiency, so that large output currents can be supplied even though the bias current in transistors 314 and 316 is very low.

A control signal generator 190 receives the envelope signal and the Vbat voltage and generates the C1 and C2 control signals. The C1 control signal is complementary to the C2 control signal. In one design, generator 190 generates the C1 and C2 control signals to select the Vboost voltage for envelope amplifier 170 when the magnitude of the envelope signal exceeds a first threshold. The first threshold may be a fixed threshold or may be determined based on the Vbat voltage. In another design, generator 190 generates the C1 and C2 control signals to select the Vboost voltage for envelope amplifier 170 when the magnitude of the envelope signal exceeds the first threshold and the Vbat voltage is below a second threshold. Generator 190 may also generate the C1 and C2 signals based on other signals, other voltages, and/or other criteria.

FIG. 3 shows an exemplary design of switcher 160 and envelope amplifier 170 in FIG. 1. Switcher 160 and envelope amplifier 170 may also be implemented in other manners. For example, envelope amplifier 170 may be implemented as described in U.S. Pat. No. 6,300,826, entitled "Apparatus and Method for Efficiently Amplifying Wideband Envelope Signals," issued Oct. 9, 2001.

Switcher 160a has high efficiency and delivers a majority of the supply current for power amplifier 130. Envelope amplifier 170a operates as a linear stage and has relatively high bandwidth (e.g., in the MHz range). Switcher 160a operates to reduce the output current from envelope amplifier 170a, which improves overall efficiency.

It may be desirable to support operation of wireless device 100 with a low battery voltage (e.g., below 2.5V). This may be achieved by operating switcher 160 based on the Vbat voltage and operating envelope amplifier 170 based on the higher Vboost voltage. However, efficiency may be improved by operating envelope amplifier 170 based on the Vboost voltage only when needed for large amplitude envelope and based on the Vbat voltage the remaining time, as shown in FIG. 3 and described above.

Figure 4A:
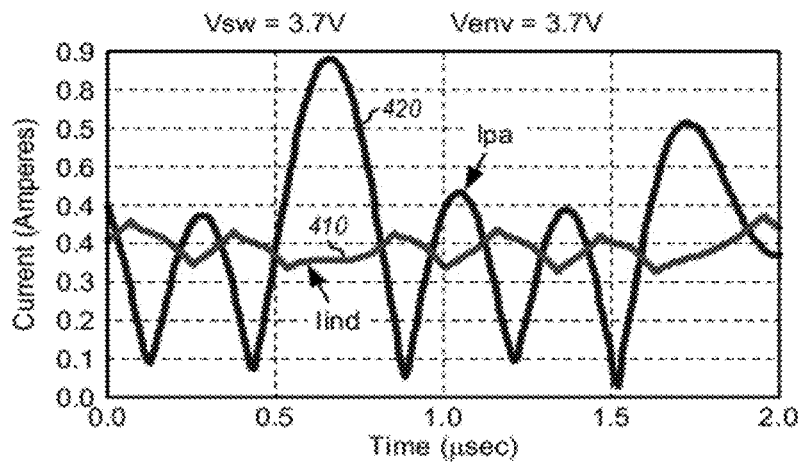
FIGS. 4A, 4B and 4C show plots of PA supply current and inductor current versus time for different supply voltages for the switcher and the envelope amplifier.

FIG. 4A shows plots of an example of the PA supply current (Ipa) and the inductor current (Iind) from inductor 162 versus time for a case in which switcher 160a has a supply voltage (Vsw) of 3.7V and envelope amplifier 170a has a supply voltage (Venv) of 3.7V. The Iind current is the current through inductor 162 and is shown by a plot 410. The Ipa current is the current provided to power amplifier 130 and is shown by a plot 420. The Ipa current includes the Iind current as well as the Ienv current from envelope amplifier 170a. Envelope amplifier 170a provides output current whenever the Ipa current is higher than the Iind current. The efficiency of switcher 160a and envelope amplifier 170a is approximately 80% in one exemplary design.

Figure 4B:
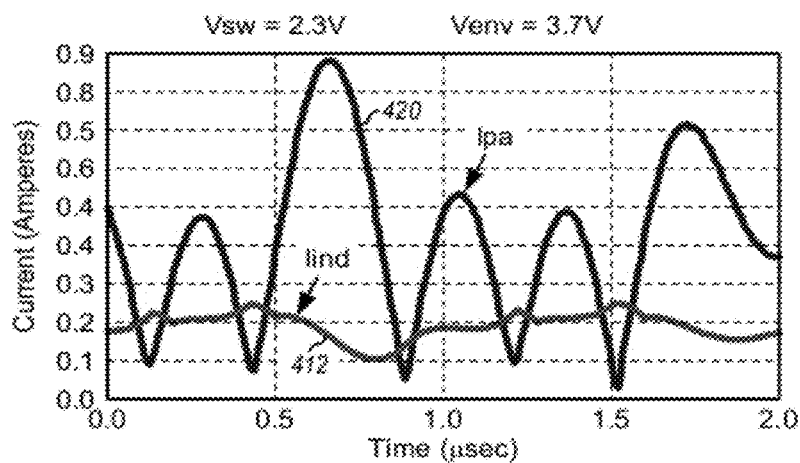

FIG. 4B shows plots of the PA supply current (Ipa) and the inductor current (Iind) versus time for a case in which switcher 160a has a supply voltage of 2.3V and envelope amplifier 170a has a supply voltage of 3.7V. The Iind current is shown by a plot 412, and the Ipa current is shown by plot 420. When the supply voltage of switcher 160a is reduced to 2.3V, inductor 162 charges more slowly, which results in a lower average Iind current as compared to the case in which the supply voltage of switcher 160a is at 3.7V in FIG. 4A. The lower Iind current causes envelope amplifier 170a to provide more of the Ipa current. This reduces the overall efficiency to approximately 65% in one exemplary design because envelope amplifier 170a is less efficient than switcher 160a. The drop in efficiency may be ameliorated by increasing the Iind current from the switcher.

Figure 5:
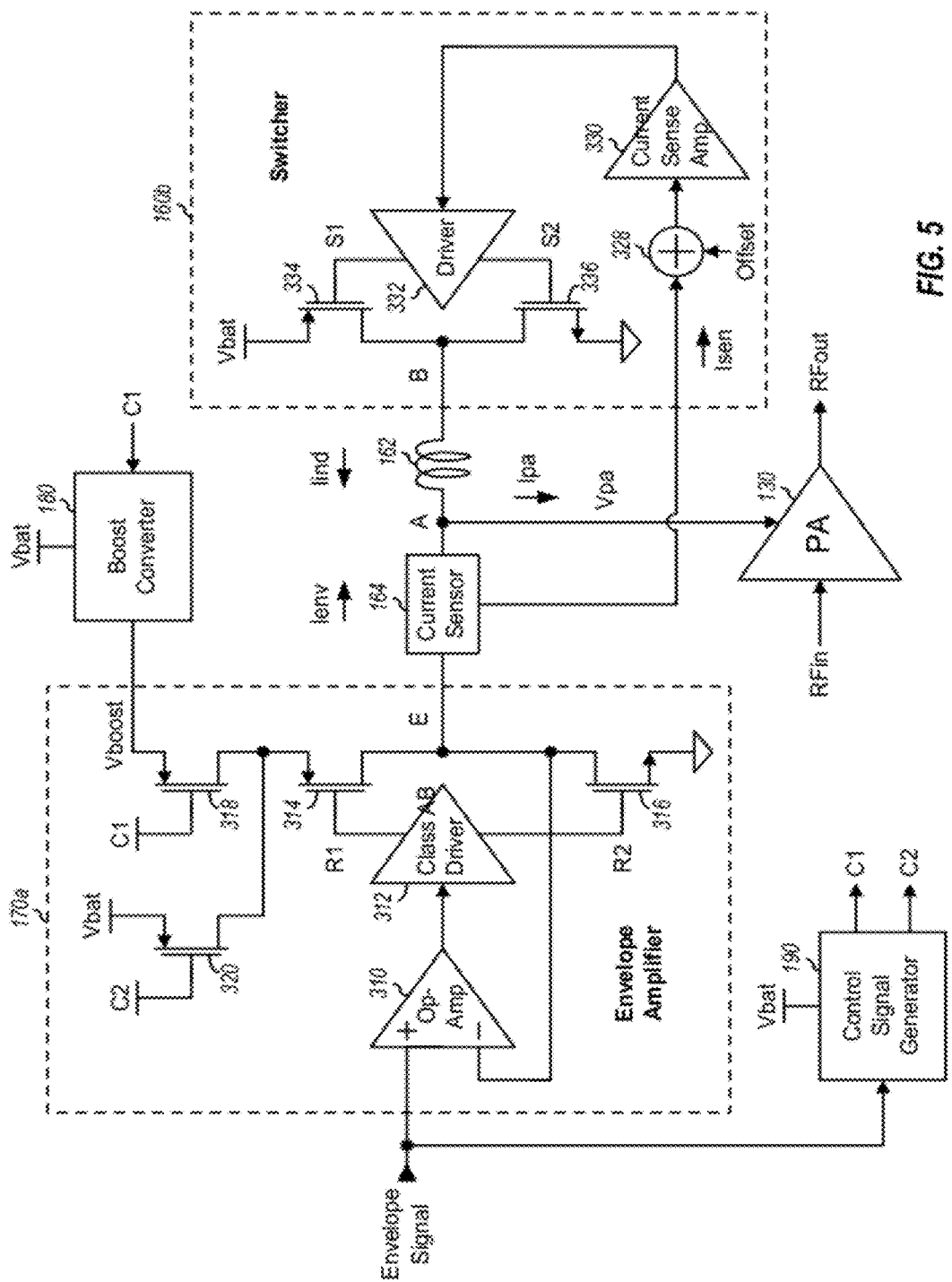
FIG. 5 shows a schematic diagram of a switcher with offset in a current sensing path.

FIG. 5 shows a schematic diagram of a switcher 160b, which is another design of switcher 160 in FIG. 1. Switcher 160b includes current sense amplifier 330, driver 332, and MOS transistors 334 and 336, which are coupled as described above for switcher 160a in FIG. 3. Switcher 160b further includes a current summer 328 having a first input coupled to current sensor 164, a second input receiving an offset (e.g., an offset current), and an output coupled to the input of current sense amplifier 330. Summer 328 may be implemented with a summing circuit (e.g., an amplifier), a summing node, etc.

Switcher 160b operates as follows. Summer 328 receives the Isen current from current sensor 164, adds an offset current, and provides a summed current that is lower than the Isen current by the offset current. The remaining circuits within switcher 160b operate as described above for switcher 160a in FIG. 3. Summer 328 intentionally reduces the Isen current provided to current sense amplifier 330, so that switcher 160 is turned On for a longer time period and can provide a larger Iind current, which is part of the Ipa current provided to power amplifier 130. The offset provided to summer 328 determines the amount by which the Iind current is increased by switcher 160b relative to the Iind current provided by switcher 160a in FIG. 3.

In general, a progressively larger offset may be used to generate a progressively larger inductor current than without the offset. In one design, the offset may be a fixed value selected to provide good performance, e.g., good efficiency. In another design, the offset may be determined based on the battery voltage. For example, a progressively larger offset may be used for a progressively lower battery voltage. The offset may also be determined based on the envelope signal and/or other information.

An offset to increase the inductor current may be added via summer 328, as shown in FIG. 5. An offset may also be added by increasing the pulse width of an output signal from current sense amplifier via any suitable mechanism.

Figure 4C:
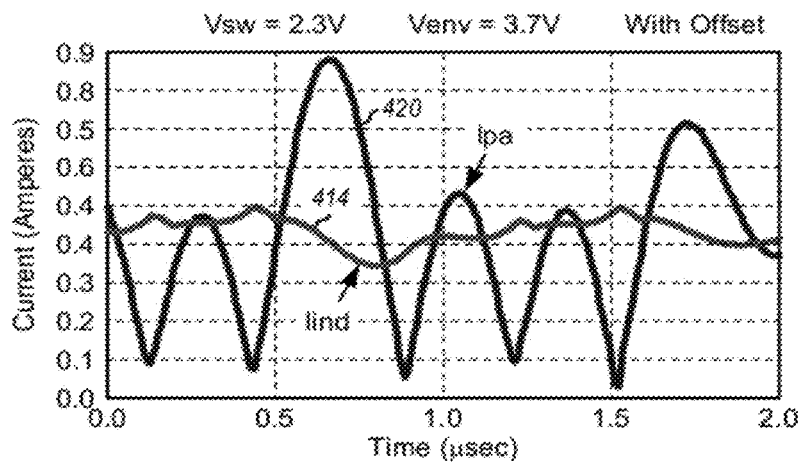

FIG. 4C shows plots of the PA supply current (Ipa) and the inductor current (Iind) versus time for a case in which switcher 160b in FIG. 5 has a supply voltage of 2.3V and envelope amplifier 170a has a supply voltage of 3.7V. The Iind current is shown by a plot 414, and the Ipa current is shown by plot 420. When the supply voltage of switcher 160b is reduced to 2.3V, inductor 162 charges more slowly, which results in a lower Iind current as shown in FIG. 4B. The offset added by summer 328 in FIG. 5 reduces the sensed current provided to current sense amplifier 330 and results in switcher 160b being turned On longer. Hence, switcher 160b with offset in FIG. 5 can provide a higher Iind current than switcher 160a without offset in FIG. 3. The overall efficiency for switcher 160b and envelope amplifier 170a is improved to approximately 78% in one exemplary design.

Figure 6:
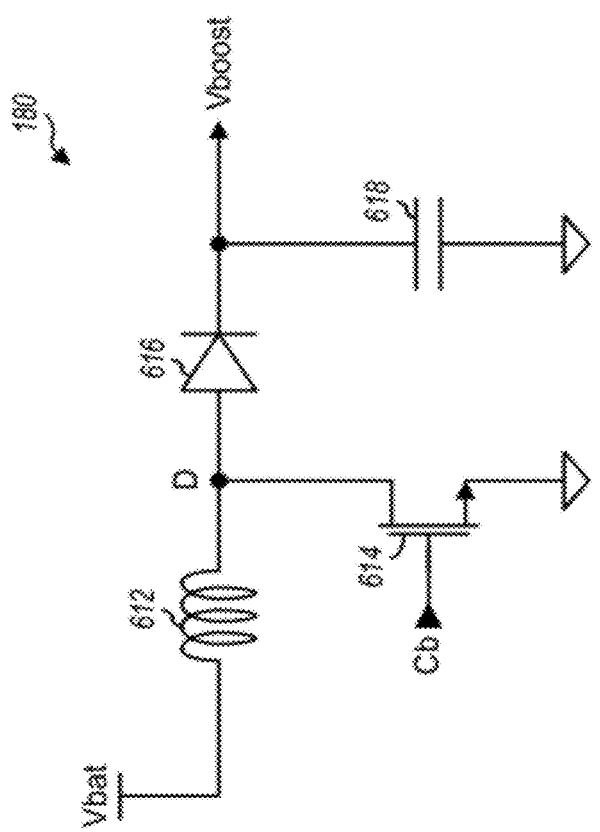
FIG. 6 shows a schematic diagram of a boost converter.

FIG. 6 shows a schematic diagram of a design of boost converter 180 in FIGS. 1, 3 and 5. Within boost converter 180, an inductor 612 has one end receiving the Vbat voltage and the other end coupled to node D. An NMOS transistor 614 has its source coupled to circuit ground, its gate receiving a Cb control signal, and its drain coupled to node D. A diode 616 has its anode coupled to node D and its cathode coupled to the output of boost converter 180. A capacitor 618 has one end coupled to circuit ground and the other end coupled to the output of boost converter 180.

Boost converter 180 operates as follows. In an On state, NMOS transistor 614 is closed, inductor 612 is coupled between the Vbat voltage and circuit ground, and the current via inductor 612 increases. In an Off state, NMOS transistor 614 is opened, and the current from inductor 612 flows via diode 616 to capacitor 618 and a load at the output of boost converter 180 (not shown in FIG. 6). The Vboost voltage may be expressed as:

$$Vboost = Vbat \cdot \frac{1}{1 - \text{Duty\_Cycle}}, \quad \text{Eq (1)}$$

where Duty_Cycle is the duty cycle in which NMOS transistor 614 is turned on. The duty cycle may be selected to obtain the desired Vboost voltage and to ensure proper operation of boost converter 180.

The techniques described herein enable an envelope tracker to operate at a lower battery voltage (e.g., 2.5V or lower). The envelope tracker includes switcher 160 and envelope amplifier 170 for the design shown in FIG. 1. In one design of supporting operation with a lower battery voltage, as shown in FIG. 3, switcher 160 is connected to the Vbat voltage and envelope amplifier 170 is connected to either the Vbat voltage or the Vboost voltage. Switcher 160 provides power most of the time, and envelope amplifier 170 provides power during peaks in the envelope of the RFout signal. The overall efficiency of the envelope tracker is reduced by the efficiency of boost converter 180 (which may be approximately 85%) only during the time in which envelope amplifier 170 provides power.

In another design of supporting operation with a lower battery voltage, the entire envelope tracker is operated based on the Vboost voltage from boost converter 180. In this design, boost converter 180 provides high current required by power amplifier 130 (which may be more than one Ampere), and efficiency is reduced by the efficiency of boost converter 180 (which may be approximately 85%).

In yet another design of supporting operation with a lower battery voltage, a field effect transistor (FET) switch is used to connect the envelope tracker to (i) the Vbat voltage when the Vbat voltage is greater than a Vthresh voltage or (ii) the Vboost voltage when the Vbat voltage is less than the Vthresh voltage. Efficiency would then be reduced by losses in the FET switch. However, better efficiency may be obtained for envelope amplifier 170 due to a lower input voltage.

In one exemplary design, an apparatus (e.g., an integrated circuit, a wireless device, a circuit module, etc.) may comprise an envelope amplifier and a boost converter, e.g., as shown in FIGS. 1 and 3. The boost converter may receive a first supply voltage and generate a boosted supply voltage having a higher voltage than the first supply voltage. The first supply voltage may be a battery voltage, a line-in voltage, or some other voltage available to the apparatus. The envelope amplifier may receive an envelope signal and the boosted supply voltage and may generate a second supply voltage (e.g., the Vpa voltage in FIG. 3) based on the envelope signal and the boosted supply voltage. The apparatus may further comprise a power amplifier, which may operate based on the second supply voltage from the envelope amplifier. The power amplifier may receive and amplify an input RF signal and provide an output RF signal.

In one design, the envelope amplifier may further receive the first supply voltage and may generate the second supply voltage based on the first supply voltage or the boosted supply voltage. For example, the envelope amplifier may generate the second supply voltage (i) based on the boosted supply voltage if the envelope signal exceeds a first threshold, or if the first supply voltage is below a second threshold, or both or (ii) based on the first supply voltage otherwise.

In one design, the envelope amplifier may include an op-amp, a driver, a PMOS transistor, and an NMOS transistor, e.g., op-amp 310, driver 312, PMOS transistor 314, and NMOS transistor 316 in FIG. 3. The op-amp may receive the envelope signal and provide an amplified signal. The driver may receive the amplified signal and provide a first control signal (R1) and a second control signal (R2). The PMOS transistor may have a gate receiving the first control signal, a source receiving the boosted supply voltage or the first supply voltage, and a drain providing the second supply voltage. The NMOS transistor may have a gate receiving the second control signal, a drain providing the second supply voltage, and a source coupled to circuit ground. The envelope amplifier may further comprise second and third PMOS transistors (e.g., PMOS transistors 318 and 320). The second PMOS transistor may have a gate receiving a third control signal (C1), a source receiving the boosted supply voltage, and a drain coupled to the source of the PMOS transistor. The third PMOS transistor may have a gate receiving a fourth control signal (C2), a source receiving the first supply voltage, and a drain coupled to the source of the PMOS transistor.

In another exemplary design, an apparatus (e.g., an integrated circuit, a wireless device, a circuit module, etc.) may comprise a switcher, an envelope amplifier, and a power amplifier, e.g., as shown in FIGS. 1 and 3. The switcher may receive a first supply voltage (e.g., a battery voltage) and provide a first supply current (e.g., the Iind current in FIG. 3). The envelope amplifier may receive an envelope signal and provide a second supply current (e.g., the Ienv current) based on the envelope signal. The power amplifier may receive a total supply current (e.g., the Ipa current) comprising the first supply current and the second supply current. The first supply current may comprise DC and low frequency components. The second supply current may comprise higher frequency components. The apparatus may further comprise a boost converter, which may receive the first supply voltage and provide a boosted supply voltage having a higher voltage than the first supply voltage. The envelope amplifier may operate based on the first supply voltage or the boosted supply voltage.

In one design, the switcher may comprise a current sense amplifier, a driver, a PMOS transistor, and an NMOS transistor, e.g., current sense amplifier 330, driver 332, PMOS transistor 334, and NMOS transistor 336 in FIG. 3. The current sense amplifier may sense the first supply current, or the second supply current (e.g., as shown in FIG. 3), or the total supply current and may provide a sensed signal. The driver may receive the sensed signal and provide a first control signal (S1) and a second control signal (S2). The PMOS transistor may have a gate receiving the first control signal, a source receiving the first supply voltage, and a drain providing a switching signal for an inductor providing the first supply current. The NMOS transistor may have a gate receiving the second control signal, a drain providing the switching signal, and a source coupled to circuit ground. The inductor (e.g., inductor 162) may be coupled to the drains of the PMOS transistor and the NMOS transistor, may receive the switching signal at one end, and may provide the first supply current at the other end.

In yet another exemplary design, an apparatus (e.g., an integrated circuit, a wireless device, a circuit module, etc.) may comprise a switcher, e.g., switcher 160b in FIG. 5. The switcher may sense an input current (e.g., the Ienv current in FIG. 5) and generate a switching signal to charge and discharge an inductor providing a supply current (e.g., the Iind current). The switcher may add an offset to the input current to generate a larger supply current than without the offset. The switcher may operate based on a first supply voltage (e.g., a battery voltage). In one design, the offset may be determined based on the first supply voltage. For example, a larger offset may be used for a smaller first supply voltage, and vice versa.

In one design, the switcher may comprise a summer, a current sense amplifier, and a driver, e.g., summer 328, current sense amplifier 330, and driver 332 in FIG. 5. The summer may sum the input current and an offset current and provide a summed current. The current sense amplifier may receive the summed current and provide a sensed signal. The driver may receive the sensed signal and provide at least one control signal used to generate the switching signal. In one design, the at least one control signal may comprise a first control signal (S1) and a second control signal (S2), and the switcher may further comprise a PMOS transistor and an NMOS transistor, e.g., PMOS transistor 334 and NMOS transistor 336 in FIG. 5. The PMOS transistor may have a gate receiving the first control signal, a source receiving first supply voltage, and a drain providing the switching signal. The NMOS transistor may have a gate receiving the second control signal, a drain providing the switching signal, and a source coupled to circuit ground.

In one design, the apparatus may further comprise an envelope amplifier, a boost converter, and a power amplifier. The envelope amplifier may receive an envelope signal and provide a second supply current (e.g., the Ienv current in FIG. 5) based on the envelope signal. The boost converter may receive the first supply voltage and provide a boosted supply voltage. The envelope amplifier may operate based on the first supply voltage or the boosted supply voltage. The power amplifier may receive a total supply current (e.g., the Ipa current) comprising the supply current from the switcher and the second supply current from the envelope amplifier.

The circuits (e.g., the envelope amplifier, the switcher, the boost converter, etc.) described herein may be implemented on an IC, an analog IC, an RF IC (RFIC), a mixed-signal IC, an ASIC, a printed circuit board (PCB), an electronic device, etc. The circuits may be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing any of the circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a boost converter operative to receive a first supply voltage and generate a boosted supply voltage having a higher voltage than the first supply voltage; and
   an envelope amplifier operative to receive an envelope signal and the boosted supply voltage and generate a second supply voltage based on the envelope signal and the boosted supply voltage, wherein the envelope amplifier is operative to further receive the first supply voltage and generate the second supply voltage based on the first supply voltage and generate the second supply voltage based on the first supply voltage or the boosted supply voltage, and further wherein the envelope amplifier comprises an operational amplifier (op-amp) operative to receive the envelope signal and provide an amplified signal, a driver operative to receive the amplified signal and provide a first control signal and a second control signal, a P-channel metal oxide semiconductor (PMOS) transistor having a gate receiving the first control signal, a source receiving the boosted supply voltage or the first supply voltage, and a drain providing the second supply voltage, and an N-channel metal oxide semiconductor (NMOS) transistor having a gate receiving the second control signal, a drain providing the second supply voltage, and a source coupled to circuit ground.

2. The apparatus of claim 1, wherein the envelope amplifier is operative to generate the second supply voltage based on the boosted supply voltage if the envelope signal exceeds a first threshold, or if the first supply voltage is below a second threshold, or both.

3. The apparatus of claim 1, wherein the envelope amplifier further comprises a second PMOS transistor having a gate receiving a third control signal, a source receiving the boosted supply voltage, and a drain coupled to the source of the PMOS transistor, and a third PMOS transistor having a gate receiving a fourth control signal, a source receiving the first supply voltage, and a drain coupled to the source of the PMOS transistor.

4. The apparatus of claim 1, further comprising:

a power amplifier operative to receive the second supply voltage from the envelope amplifier and to receive and amplify an input radio frequency (RF) signal and provide an output RF signal.

5. The apparatus of claim 1, wherein the first supply voltage is a battery voltage for the apparatus.

6. An apparatus for wireless communication, comprising:

a power amplifier operative to receive and amplify an input radio frequency (RF) signal and provide an output RF signal; and a supply generator operative to receive an envelope signal and a first supply voltage, to generate a boosted supply voltage having a higher voltage than the first supply voltage, and to generate a second supply voltage for the power amplifier based on the envelope signal and the boosted supply voltage, wherein the supply generator incorporates an operational amplifier (op-amp) operative to receive the envelope signal and provide an amplified signal, a driver operative to receive the amplified signal and provide a first control signal and a second control signal, a P-channel metal oxide semiconductor (PMOS) transistor having a gate receiving a first control signal, a source receiving the boosted supply voltage or the first supply voltage, and a drain providing the second supply voltage, and an N-channel metal oxide semiconductor (NMOS) transistor having a gate receiving the second control signal, a drain providing the second supply voltage, and a source coupled to circuit ground.

7. The apparatus of claim 6, wherein the supply generator is operative to generate the second supply voltage based on the envelope signal and either the boosted supply voltage or the first supply voltage.

8. A method of generating supply voltages, comprising:

generating a boosted supply voltage based on a first supply voltage, the boosted supply voltage having a higher voltage than the first supply voltage; and generating a second supply voltage based on an envelope signal and the boosted supply voltage, wherein the second supply voltage is generated by an envelope amplifier that produces the second supply voltage using an operational amplifier (op-amp) that receives the envelope signal and provides an amplified signal, a driver that receives the amplified signal and provides a first control signal and a second control signal, a P-channel metal oxide semiconductor (PMOS) transistor that receives the first control signal, a source that receives the boosted supply voltage or the first supply voltage, and a drain providing the second supply voltage and an N-channel metal oxide semiconductor (NMOS) transistor that receives the second control signal at a gate and provides a second supply voltage through a drain, and a source for circuit grounding.

9. The method of claim 8, wherein the generating the second supply voltage comprises generating the second supply voltage based on the envelope signal and either the boosted supply voltage or the first supply voltage.

10. An apparatus for generating supply voltages, comprising:

means for generating a boosted supply voltage based on a first supply voltage, the boosted supply voltage having a higher voltage than the first supply voltage; and means for generating a second supply voltage based on the envelope signal and the boosted supply voltage, wherein the means for generating the second supply voltage incorporates an envelope amplifier that produces the second supply voltage using an operational amplifier (op-amp) that receives the envelope signal and provides an amplified signal, a driver that receives the amplified signal and provides a first control signal and a second control signal, a P-channel metal oxide semiconductor (PMOS) transistor that receives the first control signal, a source that receives the boosted supply voltage or the first supply voltage, and a drain providing the second supply voltage and an N-channel metal oxide semiconductor (NMOS) transistor that receives the second control signal at a gate and provides a second supply voltage through a drain, and a source for circuit grounding.

11. The apparatus of claim 10, wherein the means for generating the second supply voltage comprises means for generating the second supply voltage based on an envelope signal and either the boosted supply voltage or the first supply voltage.

12. An apparatus comprising:

a switcher operative to receive a first supply voltage and provide a first supply current;

an envelope amplifier operative to receive an envelope signal and provide a second supply current based on the envelope signal; and a power amplifier operative to receive an envelope signal and provide a second supply current based on the envelope signal; and a power amplifier operative to receive a total supply current comprising the first supply current and the second supply current, wherein the switcher comprises a current sense amplifier operative to sense the first supply current, or the second supply current, or the total supply current and provide a sensed signal, a driver operative to receive the sensed signal and provide a first control signal and a second control signal, a P-channel metal oxide semiconductor (PMOS) transistor having a gate receiving the first control signal, a source receiving the first supply voltage, and a drain providing a switching signal for an inductor providing the first supply current, and an N-channel metal oxide semiconductor (NMOS) transistor having a gate receiving the second control signal, a drain providing the switching signal, and a source coupled to circuit ground.

13. The apparatus of claim 12, further comprising:
a boost converter operative to receive the first supply voltage and provide a boosted supply voltage having a higher voltage than the first supply voltage, wherein the envelope amplifier operates based on the first supply voltage or the boosted supply voltage.

14. The apparatus of claim 12, wherein the first supply current comprises direct current (DC) and low frequency components, and wherein the second supply current comprises higher frequency components.

15. An apparatus comprising:
an inductor operative to receive a switching signal and provide a supply current; and
a switcher operative to sense an input current and generate the switching signal to charge and discharge the inductor to provide the supply current, the switcher adding an offset to the input current to generate a larger supply current via the inductor than without the offset, wherein the switcher comprises
a summer operative to sum the input current and an offset current and provide a summed current,
a current sense amplifier operative to receive the summed current and provide a sensed signal, and
a driver operative to receive the sensed signal and provide at least one control signal used to generate the switching signal for the inductor.

16. The apparatus of claim 15, wherein the switcher operates based on a first supply voltage, and wherein the offset is determined based on the first supply voltage.

17. The apparatus of claim 15, wherein the at least one control signal comprises a first control signal and a second control signal, and wherein the switcher further comprises
a P-channel metal oxide semiconductor (PMOS) transistor having a gate receiving the first control signal, a source receiving a first supply voltage, and a drain providing the switching signal, and
an N-channel metal oxide semiconductor (NMOS) transistor having a gate receiving the second control signal, a drain providing the switching signal, and a source coupled to circuit ground.

18. The apparatus of claim 15, further comprising:
an envelope amplifier operative to receive an envelope signal and provide a second supply current based on the envelope signal, wherein a total supply current comprises the supply current from the switcher and the second supply current from the envelope amplifier.

19. The apparatus of claim 18, further comprising:
a boost converter operative to receive the first supply voltage and provide a boosted supply voltage having a higher voltage than the first supply voltage, wherein the envelope amplifier operates based on the first supply voltage or the boosted supply voltage.

20. The apparatus of claim 15, further comprising:
a power amplifier operative to receive the supply current from the inductor and to receive and amplify an input radio frequency (RF) signal and provide an output RF signal.

* * * * *